United States Patent
Koch et al.

(10) Patent No.: US 9,931,935 B2
(45) Date of Patent: Apr. 3, 2018

(54) CONTROL DEVICE, VEHICLE STEERING WHEEL AND METHOD FOR OPERATING A CONTROL DEVICE

(71) Applicant: TRW Automotive Electronics & Components GmbH, Radolfzell (DE)

(72) Inventors: Frank Koch, Friedrichshafen (DE); Joachim Korherr, Orsingen (DE)

(73) Assignee: TRW Automotive Electronics & Components GmbH (DE)

( * ) Notice: Subject to any disclaimer, the term of this patent is extended or adjusted under 35 U.S.C. 154(b) by 0 days.

(21) Appl. No.: 14/649,229

(22) PCT Filed: Jan. 13, 2014

(86) PCT No.: PCT/EP2014/050472
§ 371 (c)(1),
(2) Date: Jun. 3, 2015

(87) PCT Pub. No.: WO2014/108533
PCT Pub. Date: Jul. 17, 2014

(65) Prior Publication Data
US 2015/0306959 A1    Oct. 29, 2015

(30) Foreign Application Priority Data

Jan. 14, 2013 (DE) .................. 10 2013 100 355

(51) Int. Cl.
*B60K 37/06* (2006.01)
*B60Q 1/00* (2006.01)
(Continued)

(52) U.S. Cl.
CPC ............ *B60K 37/06* (2013.01); *B60Q 1/0082* (2013.01); *G06F 3/0202* (2013.01); *G06F 3/03547* (2013.01); *H03K 17/962* (2013.01); *B60K 2350/1024* (2013.01); *B60K 2350/2039* (2013.01); *B60K 2350/928* (2013.01); *G06F 2203/04809* (2013.01); *H01H 2003/0293* (2013.01); *H03K 2017/9602* (2013.01); *H03K 2217/960755* (2013.01); *H03K 2217/960785* (2013.01)

(58) Field of Classification Search
CPC ............ B60K 37/06; G06F 3/041; B62D 1/04
USPC ..................... 200/61.54; 345/184
See application file for complete search history.

(56) References Cited

U.S. PATENT DOCUMENTS

2004/0089530 A1    5/2004  Schmon et al.
2007/0119698 A1*   5/2007  Day ................ G06F 3/038
                                                  200/510

(Continued)

*Primary Examiner* — Edwin A Leon
*Assistant Examiner* — Iman Malakooti
(74) *Attorney, Agent, or Firm* — Tarolli, Sundheim, Covell & Tummino LLP

(57) ABSTRACT

A control device for a vehicle steering wheel (10) has a closed, touch-sensitive, preferably three-dimensionally shaped sensor surface (20), at least two mechanical switching elements (22) which are arranged below the sensor surface (20) and can be actuated by deforming the sensor surface (20), the touch-sensitive sensor surface (20) being designed to be so flexible that the mechanical switching elements (22) can be actuated separately, and a change-over switch (24) which can activate and/or deactivate the mechanical switching elements (22) and/or the touch-sensitive sensor surface (20).

12 Claims, 1 Drawing Sheet

(51) Int. Cl.
*H03K 17/96* (2006.01)
*G06F 3/0354* (2013.01)
*G06F 3/02* (2006.01)
*H01H 3/02* (2006.01)

(56) References Cited

U.S. PATENT DOCUMENTS

| | | | |
|---|---|---|---|
| 2009/0140994 A1* | 6/2009 | Tanaka | H01H 13/83 345/173 |
| 2012/0161795 A1 | 6/2012 | Pfau et al. | |
| 2012/0267222 A1 | 10/2012 | Gohng et al. | |

* cited by examiner

CONTROL DEVICE, VEHICLE STEERING WHEEL AND METHOD FOR OPERATING A CONTROL DEVICE

This application corresponds to PCT/EP2014/050472, filed Jan. 13, 2014, which claims the benefit of German Application No. 10 2013 100 355.9, filed Jan. 14, 2013, the subject matter of which are incorporated herein by reference in their entirety.

BACKGROUND OF THE INVENTION

The present invention relates to a control device for a vehicle steering wheel, a vehicle steering wheel, a method of operating a control device for a vehicle steering wheel.

In the automotive sector, a large variety of vehicle functions and also multimedia applications such as, e.g., radio, music or phone, are controlled by means of pushbuttons or control panels which are arranged on the vehicle steering wheel in such a way that the vehicle occupant can operate them without having to take his or her hands off the vehicle steering wheel. There is, however, an ever increasing number of applications that are intended to be controlled through such control devices. For reasons of the space available and with a view to clarity of layout, the number of switches and pushbuttons on the vehicle steering wheel can not be increased at will. Also, any unintentional operation or error in the operation of the control devices has to be avoided.

Disclosed in the prior art are, for example, control panels having a plurality of pushbuttons, the pushbuttons possibly having multiple assignments. This means that different functions can be operated by one pushbutton by actuating a change-over switch. But for reasons of appearance it is not desirable for an excessively large number of pushbuttons to be arranged on the steering wheel in addition, providing a bearing for the control surface of such pushbuttons is very complicated, and the pushbuttons need to have a minimum size for operating them. Furthermore, touch-sensitive sensor surfaces are known, which may be used for controlling a plurality of vehicle functions.

SUMMARY OF THE INVENTION

An object of the invention is to provide a control device for a vehicle steering wheel and a vehicle steering wheel that allows a simpler control of a multitude of vehicle functions. A further object of the invention is to provide a method of operating such a control element.

To achieve the object, provision is made for a control device for a vehicle steering wheel, having a closed, touch-sensitive, preferably three-dimensionally shaped sensor surface and at least two mechanical switching elements which are arranged below the sensor surface and can be actuated by deforming the sensor surface. The touch-sensitive sensor surface is designed to be so flexible that the mechanical switching elements can be actuated separately. Further, a change-over switch is provided which can activate and/or deactivate the mechanical switching elements and/or the touch-sensitive sensor surface. According to the invention, the switching elements and the sensor surface are not provided next to each other, but the switching elements are arranged beneath the sensor surface. When the touch-sensitive sensor surface is deactivated, the flexibility of the sensor surface allows the mechanical switching elements positioned underneath to be operated individually. Optionally, also the mechanical switching elements may be deactivated, so that it is only by means of touching the sensor surface that functions can be controlled.

The sensor surface may have a flat configuration, but it is also conceivable that it is three-dimensionally preshaped, so that, for example, the position of the switching elements lying underneath can be felt. In this way, the vehicle occupant is considerably less distracted when actuating the control device, and can concentrate on traffic. But the three-dimensional shape also allows the sensor surface to be adapted to the surface of the vehicle steering wheel, so that the sensor surface does not protrude from it, in addition, since the sensor surface is closed, it is made sure that the vehicle steering wheel is easier to clean, and soiling of the mechanical switching elements is reliably prevented.

The mechanical switching elements are, for example, electrical short-stroke switches which can be activated or deactivated through a very short triggering travel, it is thereby only required to push the sensor surface in slightly, so that the latter can be designed stiffer in order to improve the haptics of the vehicle steering wheel, in addition, the short operating path reliably prevents damage to the sensor surface.

To be able to operate the switching elements precisely, actuating elements are provided on the rear side of the sensor surface, for example, which actuate the short-stroke switches. Short-stroke switches have relatively small dimensions, which makes it difficult to operate them precisely. The actuating elements may have a larger surface area and an operating projection which is in contact with the short-stroke switch, as a result of which a larger area is available on the sensor surface for operating the particular mechanical switching element.

Preferably, the sensor surface is at least partially configured to be transparent or translucent, and at least one light source, in particular a light-emitting diode, is provided which can illuminate the sensor surface from the rear side. It is, for example, possible by an appropriate illumination to bring out individual regions by means of which the switching elements and/or the actuating elements are marked in the case of a flat configuration of the sensor surface. But it is also conceivable that individual portions of the sensor surface are brought out by the illumination. In particular, the actuating elements may also be made transparent, so that the light source can illuminate the rear side of the sensor surface through the actuating elements.

The sensor surface may, for example, be a capacitively touch-sensitive sensor surface, so that a simple input can be performed by touching the sensor surface.

According to the invention, further provision is made for a vehicle steering wheel including such a control device, the control device being provided in the region of the and/or the steering wheel rim. Preferably, the control device is arranged to be operated without the vehicle occupant having to change the positions of his/her hands on the steering wheel. For this reason, the control device preferably is provided in the radially outer portion of the steering wheel spokes. This allows an operation using the thumb, for example, without the vehicle occupant having to let go of the steering wheel.

The change-over switch may be arranged on the vehicle steering wheel spaced apart from the sensor surface and the mechanical switching elements, making it possible to control the change-over switch more easily. The change-over switch may be arranged, for example, such that it can be operated using one hand, whereas the sensor surface and the mechanical switching elements located underneath are arranged such that they can be operated using the other hand.

To this end, the change-over switch and the sensor surface with the mechanical switching elements may be arranged on the vehicle steering wheel offset in the peripheral direction, for example.

The change-over switch may be arranged on a first steering wheel spoke and the sensor surface and the mechanical switching elements may be arranged on a second steering wheel spoke. The steering wheel spokes additionally make an orientation easier for the vehicle occupant, so that the control device can be easily located and operated, thereby preventing a distraction of the vehicle occupant and facilitating operation.

According to the invention, further provision is made for a method of operating a control device according to the invention, the sensor surface and/or the mechanical switching elements being selectively deactivated by actuating the change-over switch, allowing a selective operation of only the switching elements or only the sensor surface.

The activation or deactivation of the switching elements or of the sensor surface can be cancelled in a time-dependent or function-dependent manner or manually, for example, if is conceivable, for example, that the censor surface is activated through the change-over switch in order to control a desired function by means of the sensor surface and, when the input and recognition of the input have been completed, the sensor surface is automatically deactivated again to avoid any further, possibly incorrect, input. It is also conceivable that after activation of the sensor surface, a time window is available to the vehicle occupant within which an input has to be effected. But a deactivation can also be performed manually by the change-over switch or by a particular operation of the sensor surface.

BRIEF DESCRIPTIONS OF THE DRAWINGS

Further advantages and features will be apparent from the description below, given in conjunction with the accompanying drawings, in which.

DESCRIPTION OF EMBODIMENT

Figure 1:
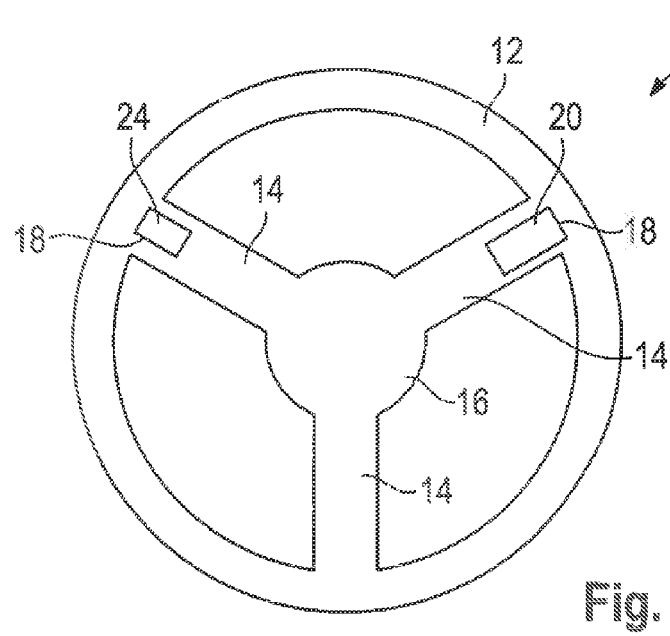
FIG. 1 shows a vehicle steering wheel according to the invention.

FIG. 1 shows a vehicle steering wheel 10 having a steering wheel rim 12 and three spokes 14, by which the steering wheel rim 12 is held to a steering wheel hub 18.

Provided on two of the spokes 14 is a control device 18 that is divided into two parts. A change-over switch 24 of the control device 18 is arranged on the first spoke 14, a touch-sensitive sensor surface 20 having a closed surface 30 is arranged on the second spoke 14.

Preferably, the sensor surface 20 is capacitively touch-sensitive, so that it can detect even light touches by the vehicle occupant. Further, in the embodiment shown here, the sensor surface 20 is made partly transparent or translucent and flexible.

Figure 2:
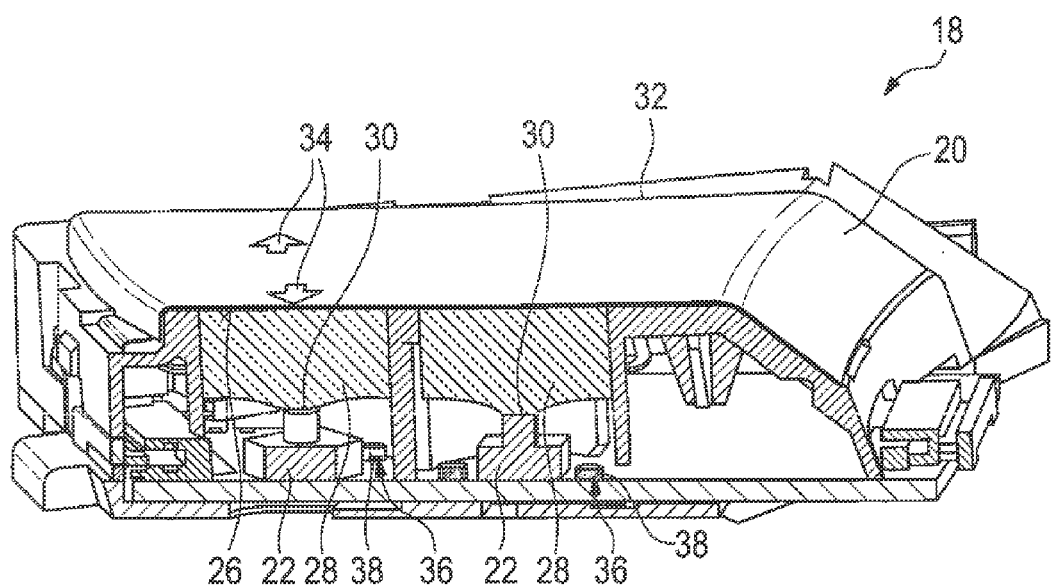
FIG. 2 shows a partial sectional view of a control device for the vehicle steering wheel of FIG. 1.

As can be seen in particular in FIG. 2, a plurality of mechanical switching elements 22 are arranged below the sensor surface 20, which are short-stroke switches in the embodiment shown here.

Respective actuating elements 28 are provided on the rear side 26 of the sensor surface 20 in the region of the mechanical switching elements 22. The actuating elements 28 are in surface contact with the rear side 28 of the sensor surface 20 and are more particularly connected thereto by an inter-material bond. The actuating elements 28 further each include a projection 30 which rests against the respective short-stroke switch or the mechanical switching element 22, so that when the sensor surface is pushed in at a specific point in the region of the actuating elements 28, an actuation of the respective mechanical switching element 22 is effected.

Provided on the surface 32 of the sensor surface 20 are symbols 34 which identify the positions of the actuating elements 28 or of the mechanical switching elements 22 located underneath.

A plurality of light sources 38, which each include a light-emitting diode 38, are further provided on the rear side 28 of the sensor surface 20. The light sources 36 allow an Illumination of the sensor surface 20 from the rear side. Preferably, the sensor surface 20 and the actuating elements 28 are made transparent or translucent, so that the light sources 38 can illuminate and/or identify regions on the surface 32 of the sensor surface 20.

The sensor surface 20 is made flexible, so that it can be deformed by exerting a higher pressure on the sensor surface 20, whereby the actuating elements 28 are displaced toward the mechanical switching elements 22 and can actuate them.

The mechanical switching elements 22 and/or the touch-sensitive sensor surface 20 can be selectively deactivated or activated by the change-over switch 24 provided on the second spoke 14. In addition, the change-over switch 24 may be used for changing over between different control levels of the mechanical switching elements 22 and the sensor surface 20.

This allows the operation or the input of different vehicle functions.

For a control of the switching elements 22, for example, the sensor surface 20 is deactivated, so that only the mechanical switching elements 22 are controlled by deforming the sensor surface 20 or pushing it in.

For a control of other functions requiring the sensor surface 20, the sensor surface 20 can be activated, so that an input is possible by a light touch of the surface 32. Optionally, the switching elements 22 located underneath may be deactivated at the same time in order to rule out an inadvertent operation of the switching elements 22.

The particular area of the sensor surface 20 which needs to be pushed in or touched for an input or an actuation of the switching elements 22 or of the sensor surface can be illuminated or marked by the light source 38. The light sources 38 may, for example, be driven such that and/or be coupled to the change-over switch 24 such that, for example, the symbols 34 are illuminated only when the mechanical switching elements 22 are in the activated condition.

Preferably, a display may also be integrated in the sensor surface 20, the display marking control regions of the sensor surface 20.

The surface 32 of the sensor surface 20 may also be three-dimensionally preshaped, so that the latter is adapted to the shape of the vehicle steering wheel 10. Alternatively, areas may be thereby marked on the surface 32 of the sensor surface 20, making it simpler to feel or palpate them.

A deactivation of the sensor surface 20 or of the switching elements 22 after actuating a function may be effected by means of the change-over switch 24. A subsequent deactivation may, however, also be performed, for example, in dependence on the gestures or functions that are input, so that, for example, once a complete input has been identified, the sensor surface 20 or the switching elements 22 are activated or deactivated in order to prevent a further input. As an alternative, the deactivation may also be effected in a time-dependent manner, so that a defined time window for input is at the vehicle occupant's disposal.

Ideally, the control device consisting of the sensor surface 20 with the switching elements 22 located underneath and the change-over switch 24 is arranged in the radially outer region of the steering wheel spokes 14 or on the steering wheel rim 12, allowing a control by the vehicle occupant without letting go of the vehicle steering wheel.

The invention claimed is:

1. A control device for a vehicle steering wheel (10), comprising a closed, capacitively touch-sensitive, preferably three-dimensionally shaped sensor surface (20), at least two mechanical switching elements (22) which are arranged below the sensor surface (20) and can be actuated by deforming the sensor surface (20), the touch-sensitive sensor surface (20) being designed to be so flexible that the mechanical switching elements (22) can be actuated separately, and a change-over switch (24) which can activate and/or deactivate the mechanical switching elements (22) and/or the touch-sensitive sensor surface (20), the change-over switch (24) being arranged on the vehicle steering wheel (10) spaced apart from the sensor surface (20) and the mechanical switching elements (22).

2. The control device according to claim 1, wherein the mechanical switching elements (22) are electrical short-stroke switches.

3. The control device according to claim 1, wherein actuating elements (28) which actuate the mechanical switching elements (22) are provided on the rear side (26) of the sensor surface (20).

4. The control device according to claim 1, wherein the sensor surface (20) is at least partially configured to be transparent or translucent, and in that at least one light source (36), in particular a light-emitting diode (38), is provided which can illuminate the sensor surface (20) on the rear side.

5. A vehicle steering wheel (10) comprising a control device according to claim 1, wherein the control device is arranged in the region of the steering wheel spokes (14) and/or the steering wheel rim (12).

6. The vehicle steering wheel according to claim 5, wherein the change-over switch (24) and the sensor surface (20) with the mechanical switching elements (22) are arranged on the vehicle steering wheel (10) offset in the peripheral direction (U).

7. The vehicle steering wheel according to claim 1, wherein the change-over switch (24) is arranged on a first steering wheel spoke (14) and the sensor surface (20) and the mechanical switching elements (22) are arranged on a second steering wheel spoke (14).

8. A method of operating a control device according to claim 1, wherein the sensor surface (20) and the mechanical switching elements (22) are selectively deactivated by actuating the change-over switch (24).

9. The method according to claim 8, wherein the deactivation can be cancelled in a time-dependent or function-dependent manner or manually.

10. A control device for a vehicle steering wheel (10), comprising:
    a deformable, touch-sensitive sensor surface (20), the sensor surface (20) having a three-dimensionally pre-shaped surface (32);
    at least two mechanical switching elements (22) arranged below the sensor surface (20), each of the at least two mechanical switching elements (22) being independently actuated with respect to one another by deforming the sensor surface (20); and
    a change-over switch (24) which activates and/or deactivates the mechanical switching elements (22) and/or the sensor surface (20), the change-over switch (24) being arranged on the vehicle steering wheel (10) spaced apart from the sensor surface (20) and the mechanical switching elements (22);
    wherein the control device is arranged in the region of the steering wheel spokes (14) and/or the steering wheel rim (12).

11. The control device according to claim 10, wherein the touch-sensitive sensor surface (20) is capacitively touch-sensitive.

12. The control device according to claim 10, wherein the change-over switch (24) is arranged on a first steering wheel spoke (14) and the sensor surface (20) and the mechanical switching elements (22) are arranged on a second steering wheel spoke (14).

* * * * *